(12) United States Patent
Suzuki et al.

(10) Patent No.: US 7,491,894 B2
(45) Date of Patent: Feb. 17, 2009

(54) HYBRID INTEGRATED CIRCUIT DEVICE

(75) Inventors: Takeshi Suzuki, Gunma (JP); Toshiyuki Ilmura, Saitama (JP); Kazushige Osumi, Gunma (JP); Shinichi Tsuyuki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 118 days.

(21) Appl. No.: 11/085,342

(22) Filed: Mar. 21, 2005

(65) Prior Publication Data
US 2005/0213308 A1 Sep. 29, 2005

(30) Foreign Application Priority Data
Mar. 25, 2004 (JP) ............... P2004-089495

(51) Int. Cl.
*H05K 1/16* (2006.01)
(52) U.S. Cl. .................. 174/260; 257/735
(58) Field of Classification Search ........... 174/260; 257/735–736; 361/783
See application file for complete search history.

(56) References Cited

U.S. PATENT DOCUMENTS

| 4,827,328 | A | | 5/1989 | Ozawa et al. | |
|---|---|---|---|---|---|
| 5,329,158 | A | * | 7/1994 | Lin | 257/666 |
| 5,523,622 | A | * | 6/1996 | Harada et al. | 257/734 |
| 5,724,233 | A | * | 3/1998 | Honda et al. | 361/813 |
| 6,326,678 | B1 | * | 12/2001 | Karnezos et al. | 257/666 |
| 6,400,010 | B1 | * | 6/2002 | Murata | 257/706 |
| 2004/0201094 | A1 | * | 10/2004 | Sato et al. | 257/700 |

FOREIGN PATENT DOCUMENTS

| JP | S62-216259 | 9/1987 |
|---|---|---|
| JP | 2000-012987 | 1/2000 |
| KR | 00422113 | 10/1987 |

OTHER PUBLICATIONS

Sanyo Electric Co., "IMST High-Density Mounting Technology," Jul. 2000, Japan.

* cited by examiner

*Primary Examiner*—Jeremy C Norris
(74) *Attorney, Agent, or Firm*—Fish & Richardson P.C.

(57) ABSTRACT

A hybrid integrated circuit device of the present invention includes: a circuit board having a front surface subjected to an insulation process; a conductive pattern formed on the front surface of the circuit board; a circuit element placed at a desired position on the conductive pattern and electrically connected to the conductive pattern; and a plurality of leads fixed to the conductive pattern and led to the outside. End portions of the leads which are led to the outside extend approximately parallel to the circuit board in a plane different from that of the front surface of the circuit board.

17 Claims, 7 Drawing Sheets

HYBRID INTEGRATED CIRCUIT DEVICE

BACKGROUND OF THE INVENTION

Priority is claimed to Japanese Patent Application Number JP2004-089495 filed on Mar. 25, 2004, the disclosure of which is incorporated herein by reference in its entirety.

1. Field of the Invention

The present invention relates to a hybrid integrated circuit device. In particular, the present invention relates to a hybrid integrated circuit device having leads led to the outside.

2. Description of the Related Art

With reference to FIGS. 6A and 6B, the constitution of a conventional hybrid integrated circuit device 100 will be described. FIG. 6A is a plan view of the conventional hybrid integrated circuit device 100, and FIG. 6B is a cross-sectional view showing a packaging structure thereof.

Referring to FIG. 6A, a conductive pattern 102 is formed on the front surface of a circuit board 101 made of metal such as aluminum with an insulating layer interposed therebetween, and a desired hybrid integrated circuit device is realized by mounting circuit elements 105 at predetermined positions on the conductive pattern 102. Here, an IC, a chip resistor, a chip capacitor, a power transistor, and the like are adopted as the circuit elements 105, and a transistor mounted face-up is electrically connected to the conductive pattern 102 through fine metal wires 103. A plurality of pads 102A of the conductive pattern 102 are formed on one side edge of the circuit board 101. At the positions of the pads 102A, leads 104 are fixed with brazing material such as solder.

Referring to FIG. 6B, the hybrid integrated circuit device 100 is fixed to a mount board 111 by inserting the leads 104 into holes made in the mount board 111, thus establishing electrical connection. Further, in order to prevent the leads 104 from bending due to vibration or the like, the leads 104 have curved shapes.

With reference to FIG. 7, one example of a circuit formed in the hybrid integrated circuit device 100 will be described. FIG. 7 is a conceptual diagram showing the outline of a circuit formed on the front surface of the circuit board 101.

Here, a plurality of channels CH, each of which is an amplifier circuit for amplifying a signal inputted from one lead 104 and outputting the amplified signal from one lead 104, are formed on the front surface of the circuit board 101. Three channels each having such a circuit configuration are constituted.

A first channel CH1 is formed in the vicinity of a middle portion of the circuit board 101. A second channel CH2 is formed to surround the first channel CH1. A third channel CH3 is formed to surround the second channel CH2. This technology is described for instance in Japanese Patent Publication No. 2000-12987 (page 4, FIG. 1).

However, in the hybrid integrated circuit device 100, since the leads 104 are long, parasitic inductance are generated. This destabilizes the operation of the entire device. Further, the entire device is vertically fixed to a mount board in an upright position. This inhibits the thinning of a set in which the hybrid integrated circuit device is incorporated.

Moreover, if a plurality of channels are formed on the circuit board 101 in the case where the leads 104 are fixed on one edge of the circuit board 101, the length of each channel becomes uneven, and there has been the fear of problems such as electrical signal delay. Further, in order to equalize the length of each channel, means for crossing interconnections using jumper wires or the like are necessary. There has been the fear that this may newly increase the number of manufacturing steps and generate inductance sources.

Furthermore, there are cases where the voltages of input signals inputted into the hybrid integrated circuit device and those of output signals outputted from the hybrid integrated circuit device are greatly different from each other. In such a case, if a lead through which an input signal passes and a lead through which an output signal passes are adjacent to each other, there has been the problem that either of these signals is affected by the other.

SUMMARY OF THE INVENTION

The present invention has been accomplished in light of the above-described problems. The present invention provides a hybrid integrated circuit device having leads for stable operation.

A hybrid integrated circuit device of the present invention includes: a circuit board having a front surface subjected to an insulation process; a conductive pattern formed on the front surface of the circuit board; a circuit element placed at a desired position on the conductive pattern and electrically connected to the conductive pattern; and a plurality of connecting means fixed to the conductive pattern and led to an outside. This hybrid integrated circuit device is surface-mounted on a mount board using the connecting means. The connecting means in the present invention are means for ensuring electrical continuity between an electric circuit constituted inside and the outside. As the connecting means, brazing material such as solder, leads, or the like can be adopted.

Further, in the hybrid integrated circuit device of the present invention, the connecting means are leads each having one end portion fixed to the conductive pattern, and end portions of the leads which are led to the outside extend approximately parallel to the circuit board in a plane different from that of the front surface of the circuit board.

Further, in the hybrid integrated circuit device of the present invention, the end portions of the leads which are led to the outside extend to protrude in the same direction as a direction in which the circuit element is mounted.

Further, in the hybrid integrated circuit device of the present invention, the leads are formed in gull-wing shapes.

Further, in the hybrid integrated circuit device of the present invention, the circuit element is placed on a front surface of the mount board, in a region corresponding to a place under the circuit board.

Further, in the hybrid integrated circuit device of the present invention, a conducting path is formed on a front surface of the mount board, in a region corresponding to a place under the circuit board; and the conducting path is connected to ground potential.

Further, a hybrid integrated circuit device of the present invention includes: a circuit board having a front surface subjected to an insulation process; a conductive pattern formed on the front surface of the circuit board; a circuit element placed at a desired position on the conductive pattern and electrically connected to the conductive pattern; and a plurality of connecting means fixed to the conductive pattern in a peripheral portion of the circuit board and led to an outside. The connecting means include first connecting means into which an input signal is inputted and second connecting means to which an output signal controlled by the input signal is outputted. The first and second connecting means are fixed to opposite edge portions of the circuit board, respectively.

Further, in the hybrid integrated circuit device of the present invention, a circuit generating the output signal by amplifying the input signal is formed of the conductive pattern and the circuit element; and the circuit is formed on the front surface of the circuit board, in a region sandwiched between the first and second connecting means.

Further, in the hybrid integrated circuit device of the present invention, the plurality of circuits are arranged in parallel on the front surface of the circuit board.

Further, in the hybrid integrated circuit device of the present invention, the connecting means are leads.

The present invention has the following effects.

A hybrid integrated circuit device can be surface-mounted on a mount board by fixing tip portions of leads to the mount board with brazing material such as solder. Accordingly, compared to conventional examples, the length of leads can be reduced. Thus, it is possible to prevent a malfunction and the like of a circuit due to inductive components originating in the leads. Further, since the entire device can be surface-mounted, mounting on the mount board can be easily performed.

Moreover, the problem of electrical signal delay can be avoided because, in an opposite edge portion of a circuit board from first leads through which input signals pass, second leads through which output signals controlled by the input signals pass are provided. Furthermore, in the case where a plurality of channels are provided on the front surface of the circuit board, the lengths of paths of the channels can be equalized by arranging the channels in parallel.

DESCRIPTION OF THE PREFERRED EMBODIMENTS

Figure 1A:
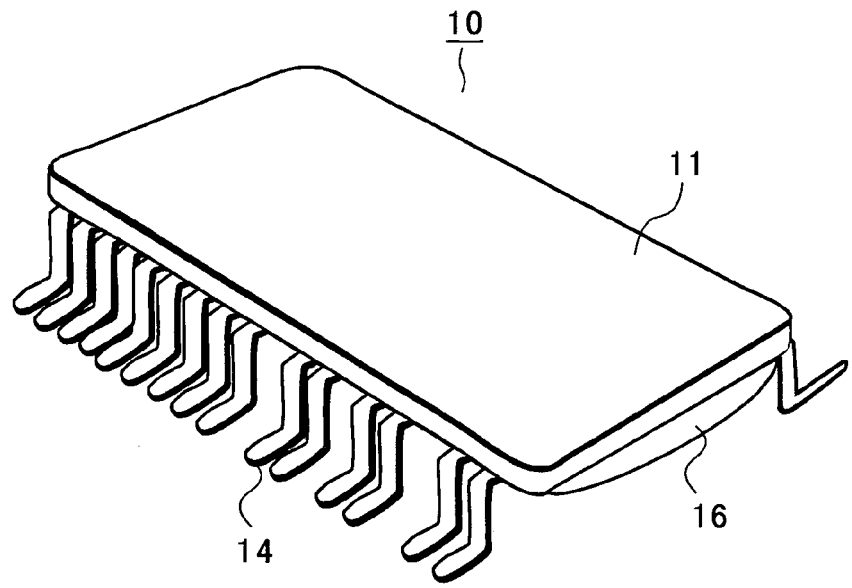
FIG. 1A is a perspective view of a hybrid integrated circuit device of the preferred embodiment.
Figure 1B:
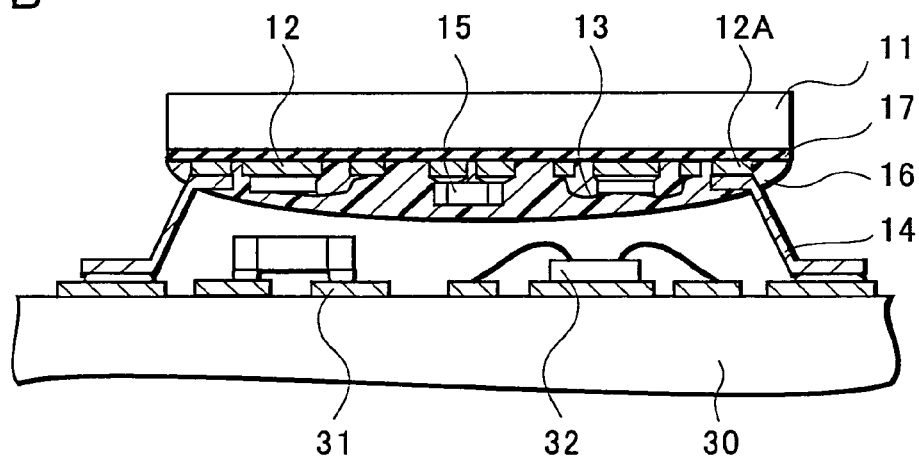
FIGS. 1B and 1C are cross-sectional views thereof.
Figure 1C:
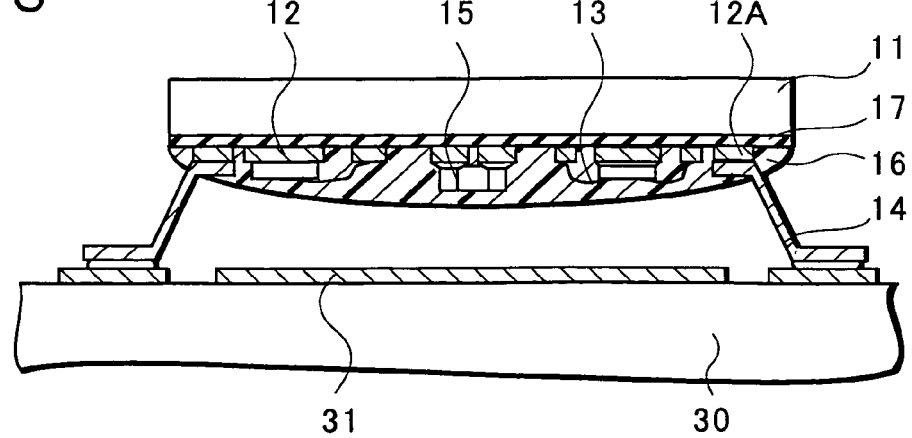

With reference to FIGS. 1A to 1C, the constitution of a hybrid integrated circuit device 10 will be described. FIG. 1A is a perspective view of the hybrid integrated circuit device 10, and FIG. 1B is a cross-sectional view showing a mount mode thereof. FIG. 1C is a cross-sectional view showing another mount mode.

Referring to FIGS. 1A and 1B, metal such as aluminum or copper is adopted as material for a circuit board 11. Alternatively, alloy may be adopted as material for the circuit board 11. Here, the circuit board 11 made of aluminum is adopted. For example, both sides thereof are anodized. An insulating layer 17 is formed on the front surface of the circuit board 11, and has the function of insulating a conductive pattern 12 from the circuit board 11. Further, filler such as alumina may be added to the insulating layer 17 at high density in order to actively transfer heat generated in circuit elements 15 to the circuit board 11. Here, oxide such as $Al_2O_3$ formed on the surface of the aluminum board for the purpose of insulation and the like is not necessarily essential. Accordingly, the front surface of the circuit board may be subjected to other insulation process. Further, the circuit board 11 may penetrate the insulating layer 17 formed on the front surface thereof to be electrically connected to the conductive pattern 12. In this case, the operation of an electric circuit formed on the front surface is stabilized by connecting the circuit board 11 to ground potential.

Moreover, other than a board made of metal, a board of other type, such as a flexible sheet, a printed circuit board, or a ceramic board, can be adopted as the circuit board 11. Furthermore, the conductive pattern 12 having a multilayer wiring structure can also be constituted on the front surface of the circuit board 11.

The conductive pattern 12 is provided on the surface of the insulating layer 17 and formed of metal such as copper. The circuit elements 15 are fixed at predetermined positions on the conductive pattern 12. A plurality of pads 12A of the conductive pattern 12 are placed on side edges of the circuit board 11. A predetermined electric circuit is formed on the circuit board 11 by fixing the circuit elements 15 at the predetermined positions on the conductive pattern 12. For example, a plurality of bridge circuits are formed on the front surface of the circuit board 11. Further, the conductive pattern 12 may be covered with a resin coating, except for electrical connection points.

The circuit elements 15 are mounted at the predetermined positions on the conductive pattern 12 with brazing material such as solder interposed therebetween. As the circuit elements 15, a passive element, an active element, a circuit device, and the like can be widely adopted. Further, in the case where a power element is mounted, the relevant element may be mounted on a heat sink fixed on the conductive pattern. A transistor or an IC, which is mounted face-up, is electrically connected to the conductive pattern 12 through thin metal wires 13. Further, a resin-packaged IC may be fixed as the circuit element 15 to the conductive pattern 12. As examples of the circuit elements 15, a power switching element and an IC which controls the power switching element can be adopted. Further, as the passive element, a chip resistor or a chip capacitor can be adopted.

A semiconductor element applicable to the present application is, for example, a metal-oxide-semiconductor field effect transistor (MOSFET). More preferably, it is possible to adopt a power MOSFET which performs switching with an amplitude of 50V or more, or a semiconductor element which operates at high speed with small amplitude. Furthermore, a semiconductor element constituting a bridge circuit can be adopted.

Sealing resin 16 covers the conductive pattern 12 formed on the front surface of the circuit board 11 and the circuit elements 15. Here, the sealing resin 16 is formed only on the front surface of the circuit board 11 by potting. Alternatively, the sealing resin 16 may be formed to cover all surfaces of the circuit board 11. This makes it possible to improve the moisture resistance of the entire device. Further, the sealing resin 16 may be formed by transfer molding.

Leads 14 are fixed to the pads 12A of the conductive pattern 12 with brazing material such as solder, and, for example, have the function of performing electrical input/output to/from the outside. That is, the leads 14 function as connecting means. Here, the leads 14 are provided on two opposite longitudinal edges of the circuit board 11. Furthermore, one ends of the leads 14 are fixed to the pads 12A of the conductive pattern, and the other ends of the leads 14 extend approximately parallel to the circuit board 11. Further, the leads 14 are formed in gull-wing shapes. That is, portions in contact with the pads 12A and conducting paths 31 are formed to be parallel to the circuit board 11, and middle portions extend in directions oblique to the circuit board 11. Further, as a replacement for the leads 14 as connecting means, brazing material such as solder can also be adopted.

With reference to FIG. 1B, a mount structure of the hybrid integrated circuit device 10 will be described. Here, the hybrid integrated circuit device 10 is mounted on the conducting paths 31 formed on the front surface of a mount board 30. Tip portions of the leads 14 are bonded to the mount board 30 with brazing material, whereby the hybrid integrated circuit device 10 is surface-mounted on the mount board 30. Accordingly, the hybrid integrated circuit device 10 can be treated as one of surface-mounted components similarly to other mounted circuit components (e.g., chip components). That is, compared to a mount structure in which leads are inserted into a mount board as in conventional examples, a mount process can easily performed. Here, the leads 14 have gull-wing shapes protruding in the same direction as the direction in which the circuit elements 15 are mounted.

With the aforementioned constitution of the leads 14, the leads 14 can be shortened compared to conventional examples. Accordingly, even in the case where a high-frequency electrical signal is passed through the lead 14, the amount of inductance originating in the lead 14 can be reduced. Thus, the operation of the electric circuit formed on the front surface of the circuit board 11 can be stabilized. In particular, when an input signal inputted into the hybrid integrated circuit device is considered, in the case where the frequency of the input signal, which is a digital signal, is several hundreds of kilohertz, spectral components constituting this digital signal include components of several megahertz. Accordingly, in the case where such an electrical signal of a very high frequency passes, it is very meaningful to shorten the leads 14 by adopting the leads 14 having the aforementioned shapes.

Moreover, if a circuit which performs a digital process is incorporated in the hybrid integrated circuit device 10, the number of terminals for performing input/output of digital signals increases. Accordingly, in the preferred embodiment, a plurality of leads 14 are provided along the opposite longitudinal edges of the circuit board 11, thus making it possible to provide a larger number of leads 14. Further, the leads 14 can also be provided along four edges of the circuit board 11.

In a region corresponding to a place under the circuit board 11, the conducting paths 31 are formed on the front surface of the mount board 30, and circuit elements 32 are mounted at desired positions on the conducting paths 31. This constitution makes it possible to constitute an electric circuit even in a region under the circuit board 11. Accordingly, the packaging density of the entire mount board 30 can be improved. Further, as the circuit element 32, a capacitor for reducing noise can be adopted. The placement of a capacitor under the circuit board 11 can reduce the distance between the electric circuit incorporated in the hybrid integrated circuit device 10 and the capacitor mounted on the mount board 30. Accordingly, the noise reduction effect of the capacitor can be maximized.

Referring to FIG. 1C, in the region corresponding to the space under the circuit board 11, a conducting path 31 is formed on the front surface of the mount board 30. Further, the conducting path 31 is connected to ground potential. This allows the barrier effect of the conducting path 31 to be exerted, and makes it possible to prevent noise generated in the electric circuit formed on the front surface of the circuit board 11 from passing through the mount board 30 and propagating to the outside.

Figure 2A:
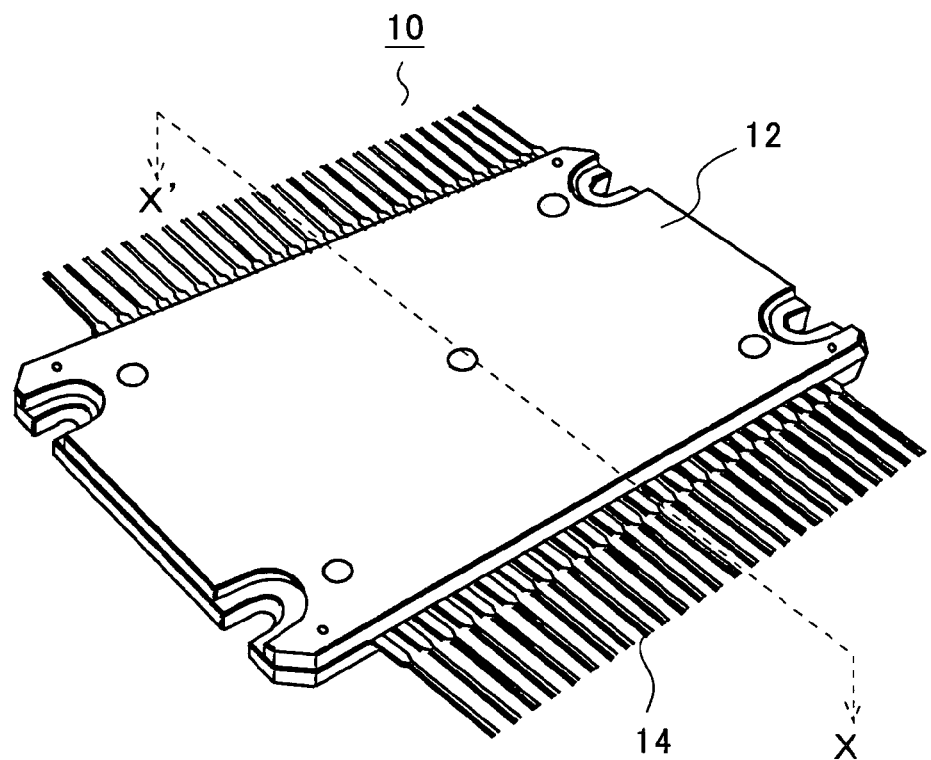
FIG. 2A is a perspective view of a hybrid integrated circuit device of the preferred embodiment.
Figure 2B:
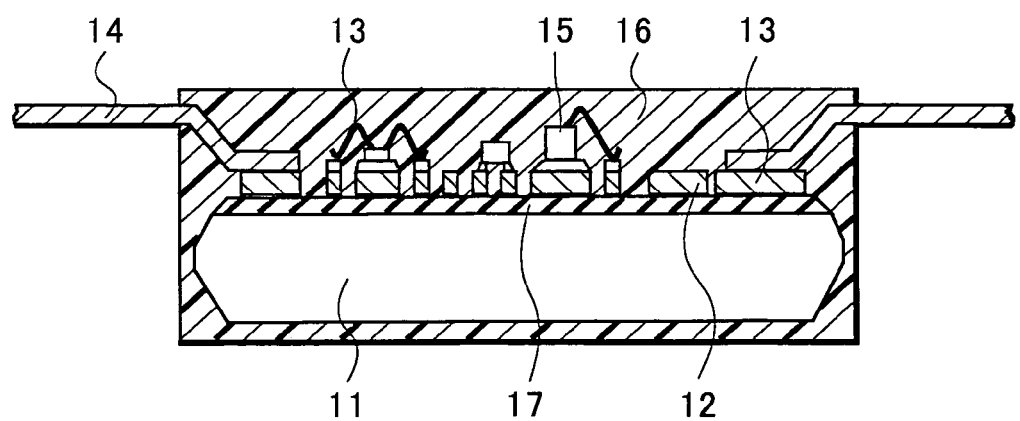
FIG. 2B is a cross-sectional view thereof.

With reference to FIGS. 2A and 2B, the constitution of the hybrid integrated circuit device 10 of another embodiment will be described. FIG. 2A is a perspective view of the hybrid integrated circuit device 10, and FIG. 2B is a cross-sectional view thereof. The basic constitution of the hybrid integrated circuit device shown in these drawings is the same as that shown in FIGS. 1A to 1C, and the difference therebetween is sealing style.

Here, the sealing resin 16 seals the entire circuit board 11 including the back surface thereof. The sealing resin 16 can be formed by injection molding using thermoplastic resin or transfer molding using thermosetting resin. By sealing the entire device with the sealing resin 16 as described above, the moisture resistance and shock resistance of the entire device can be improved. Furthermore, sealing with the sealing resin 16 can also be performed with the back surface of the circuit board 11 exposed. In this case, heat can be actively released to the outside through the exposed back surface of the circuit board 11. Further, the effect of heat release through the sealing resin 16 can be improved by mixing filler into the sealing resin 16.

Figure 3:
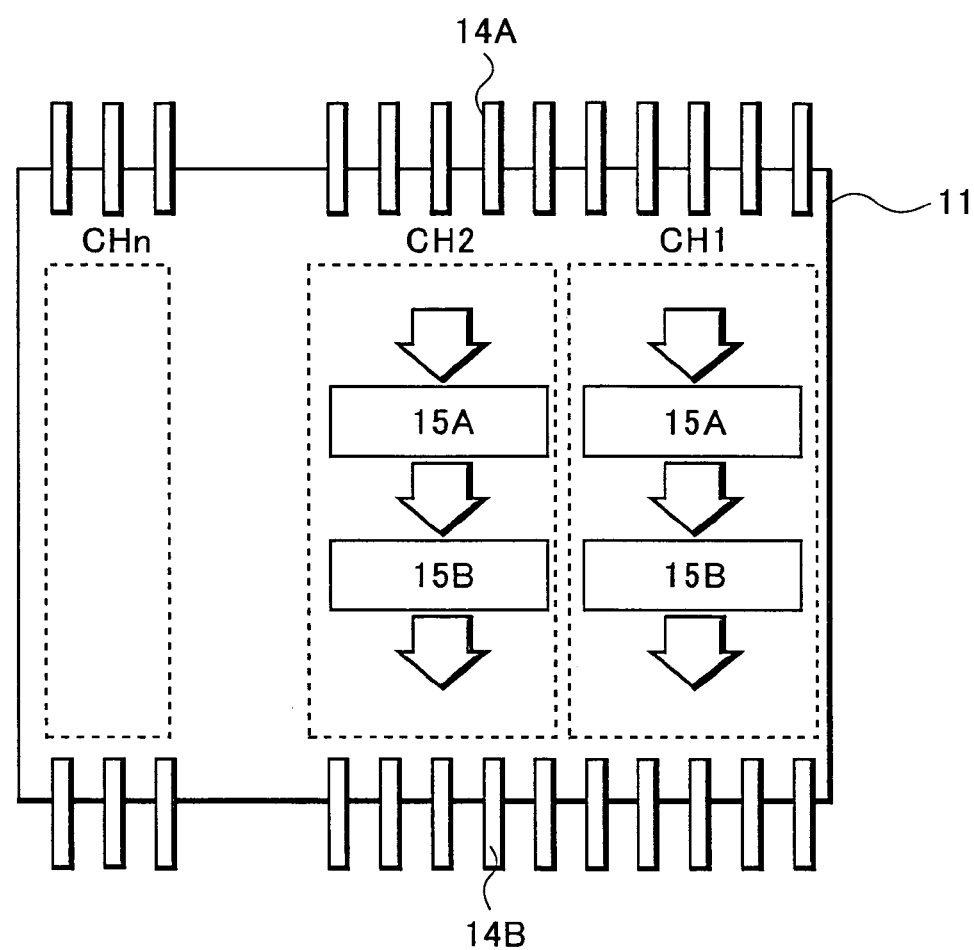
FIG. 3 is a plan view of the hybrid integrated circuit device of the preferred embodiment.

With reference to FIG. 3, one example of a circuit incorporated in the hybrid integrated circuit device 10 of this embodiment will be described. This drawing is a plan view of the circuit board 11.

Referring to this drawing, the leads 14 include first leads 14A and second leads 14B. The first leads 14A are fixed to the longitudinal edge located in the upper part of the drawing at approximately equal intervals, and the second leads 14B are provided at approximately equal intervals to be opposite to the first leads 14A.

The first leads 14A are leads through which electrical signals inputted into the circuit formed on the front surface of the circuit board 11 pass. As the electrical signals, digital input signals having voltages of approximately several volts can be adopted. In general, the voltage of an input signal is 5 V. However, in recent years, an input signal having a lower voltage, such as approximately 3 V or 2.5 V, is sometimes used in order to reduce power consumption.

The second leads 14B are leads through which output signals obtained from processes performed based on the electrical signal inputted from the first leads 14A pass. As the output signals, analog signals having voltages of approximately several tens of volts to several hundreds of volts can be adopted. As the analog signals, for example, audio output signals can be cited. Further, electrical signals which pass through the second leads 14B may also be digital signals.

On the front surface of the circuit board 11, a plurality of channels, which are amplifier circuits for amplifying the input signals into the output signals, are provided in parallel. Here, a first channel CH1, a second channel CH2, . . . , and an Nth channel CHn are provided. The number of channels provided in parallel can be changed according to the intended use.

The first channel CH1 is an amplifier circuit including a control element 15A and a power element 15B. In the first channel CH1, a digital input signal inputted from the first lead 14A is amplified to be outputted from the second lead 14B. Further, the first channel CH1 is a circuit including a control element 15A and a power element 15B. The control element 15A, which is, for example, an IC, performs a calculation on the input signal in accordance with a predetermined rule and controls the power element 15B. The power element 15B is, for example, a power switching element such as an IGBT, and a control electrode thereof is connected to the control element 15A. Further, the power element 15B performs switching in accordance with a control signal from the control element 15A. Moreover, an output signal from the power element 15B is outputted to the outside through the second lead 14B. Other channels including the second channel CH2 and subsequent channels each have basically the same constitution as that of the first channel CH1 described above.

An advantage of this embodiment is that the first leads 14A through which input signals pass and the second leads 14B through which output signals pass are respectively fixed to opposite edge portions of the circuit board 11. Specifically, as described previously, the voltages of input signals are low voltages of approximately 5 V and becoming lower in order to reduce power consumption. On the other hand, the voltages of output signals which pass through the second leads 14B are high voltages of approximately several tens to one hundred volts. Accordingly, in the case where the second leads 14B are provided in the vicinity of the first leads 14A, noise generated in the second leads 14B may affect the first leads 14A. Accordingly, interference between the first leads 14A and the second leads 14B can be prevented by placing the first leads 14A and the second leads 14B in opposite edge portions of the circuit board 11, respectively, as in this embodiment.

Figure 4:
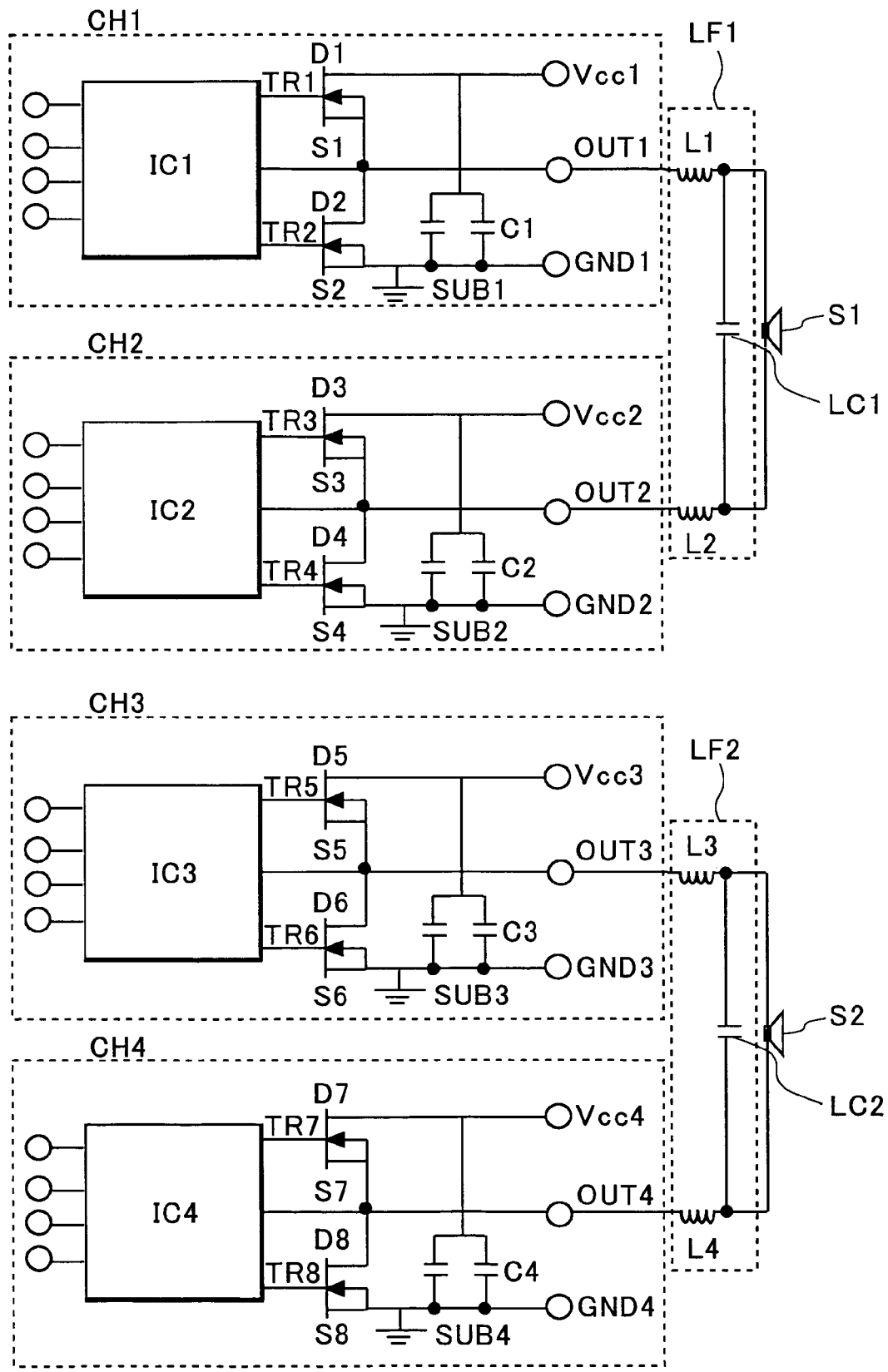
FIG. 4 is a circuit diagram of the hybrid integrated circuit device of the preferred embodiment.

With reference to FIG. 4, an example of a circuit constituted in the hybrid integrated circuit device 10 will be described. Here, in the hybrid integrated circuit device 10, four channels including a first channel CH1, a second channel CH2, a third channel CH3, and a fourth channel CH4 are constituted, each of which constitutes a half bridge circuit. Further, output signals of these channels are converted into analog signals by lowpass filters. That is, in the preferred embodiment, pulse width modulation (PWM) in which class D amplification is performed is performed.

Details of the first channel CH1 will be described. TR1 and TR2 are switching elements constituting a bridge circuit. For example, power MOSFETs can be adopted. The gate electrodes of TR1 and TR2 are connected to a first control element IC1, and TR1 and TR2 perform switching in accordance with electrical signals from IC1. The drain electrode D1 of TR1 is connected to a first power source Vcc1. Further, S1, which is the source electrode of TR1, is connected to the drain electrode D2 of TR2, and a first output OUT1 is extracted from an intermediate position between S1 and D2. The source electrode S2 of TR2 is connected to a first ground potential GND1, and connected to a first connection point SUB1 of the circuit board 11 in the vicinity of TR1 and TR2. Here, an electrical signal inputted into IC1 passes through the first lead 14A of this embodiment. Further, OUT1, which is an output signal, passes through the second lead 14B of this embodiment.

Figure 5A:
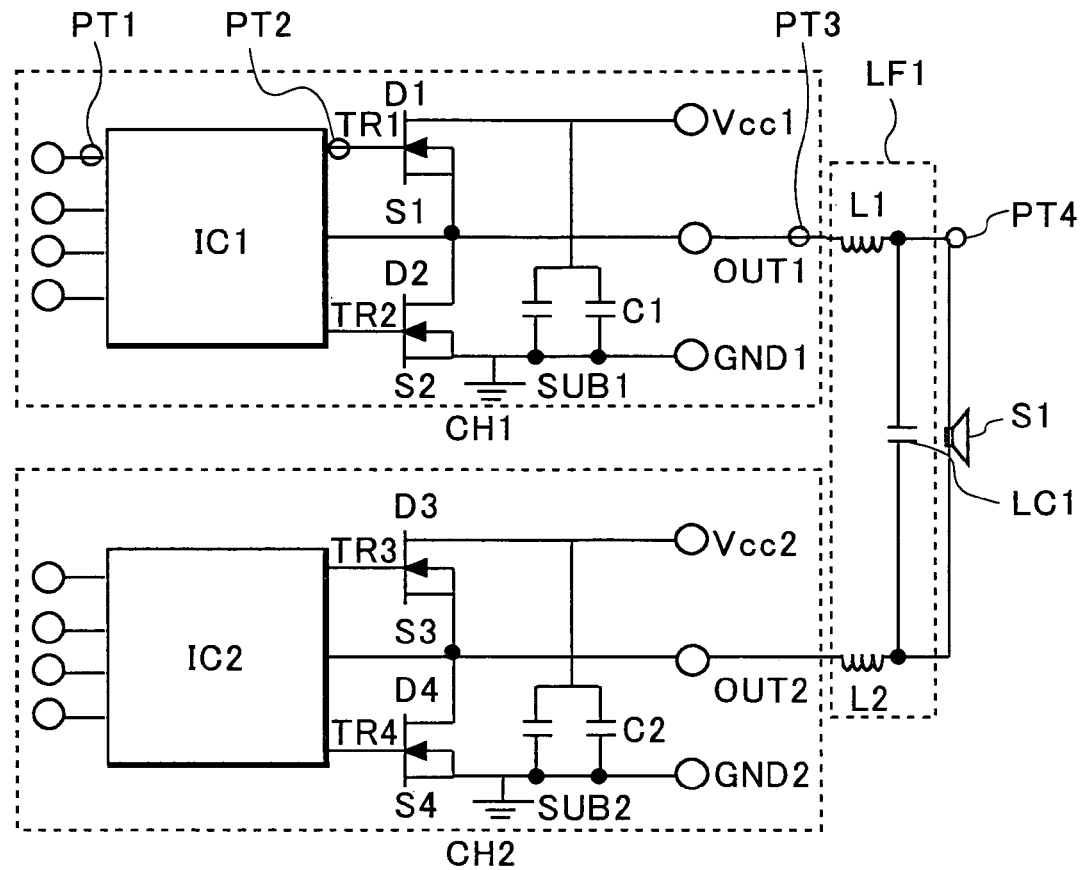
FIG. 5A is a circuit diagram of the hybrid integrated circuit device of the preferred embodiment.
Figure 5B:
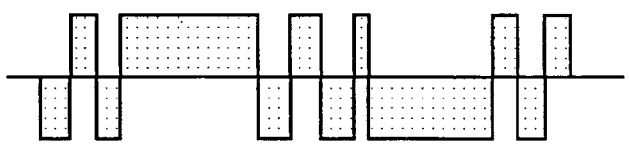
FIGS. 5B and 5C are characteristic diagrams thereof.

An electrical signal passed through the first lead 14A and inputted into IC1 is, for example, a digital signal having a PWM waveform as shown in FIG. 5B. A digital signal having a PWM waveform is a signal which is very sensitive to noise compared to an ordinary digital signal. Accordingly, with the constitution of this embodiment, noise in output signals can be prevented from affecting input signals by separating the first leads 14A and the second leads 14B. Here, a signal inputted into IC1 may be an analog signal.

A first capacitor C1, which is a coupling capacitor, is provided to short the first ground potential GND1 and the first power source Vcc1. Furthermore, one or two first capacitors C1 are provided in parallel in the vicinity of the first connection point SUB1. Accordingly, even if the potential of the circuit board 1 in the vicinity of TR1 and TR2 increases due to high-speed operation of TR1 and TR2, the potential immediately flows into the first capacitor or capacitors C1.

In the second channel CH2, which has a constitution similar to that of the first channel CH1 described above, an output signal is outputted from OUT2. Further, the first and second channels CH1 and CH2 constitute an H-bridge circuit. That is, the first and second outputs OUT1 and OUT2, which are pulse signals, are connected to a first lowpass filter LF1, whereby the digital signals are converted into an analog signal. Further, a first speaker S1, which is a load, operates according to the analog signal.

The third and fourth channels CH3 and CH4 each constitute a half bridge similar to that of the first channel CH1 described previously, and collectively constitute an H bridge. That is, third and fourth outputs OUT3 and OUT4, which are pulse signals, are converted into an analog signal by a second lowpass filter LF2. Further, a second speaker S2 operates according to the analog signal.

In this embodiment, electrical signals inputted into the ICs pass through the first leads 14A. Further, power signals Vcc, OUT, and GND pass through the second leads 14B. Accordingly, in the hybrid integrated circuit device 10 of this embodiment, digital signals having PWM waveforms are inputted, and digital signals having PWM waveforms with amplitudes larger than those of the inputted signals are outputted. Furthermore, coils and capacitors constituting lowpass filters can also be incorporated in the hybrid integrated circuit device 10. In this case, analog signals amplified based on inputted digital signals are outputted from the second leads 14B.

Figure 5C:
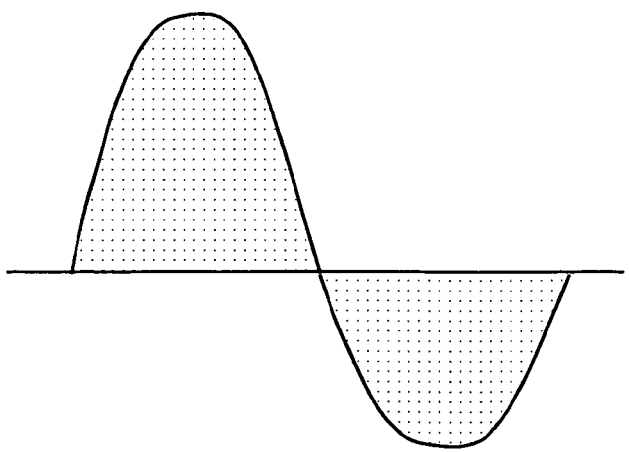
Figure 6A:
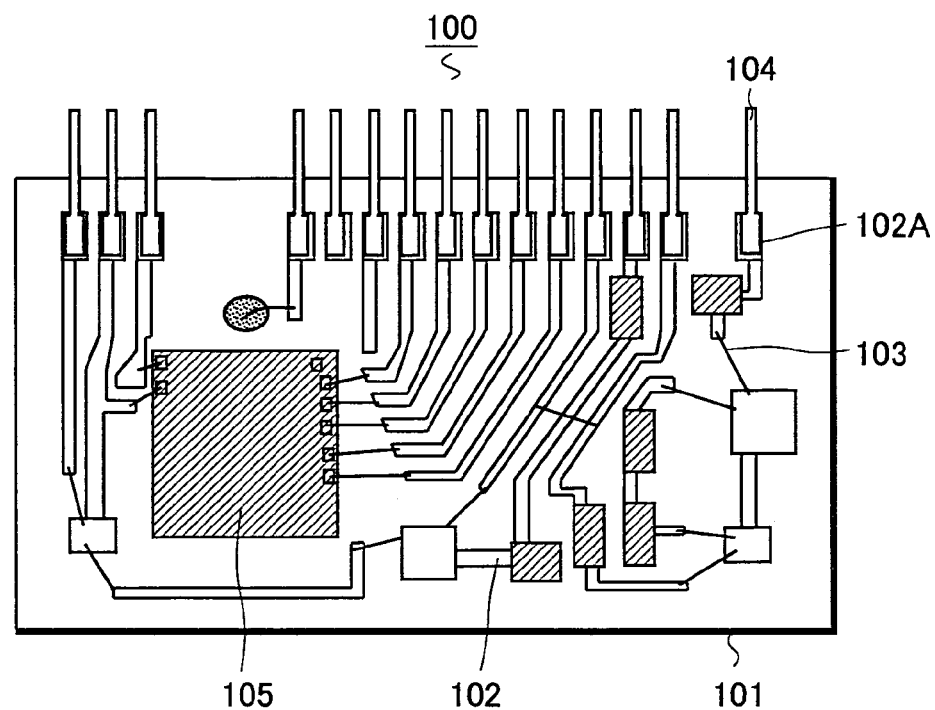
FIGS. 6A and 6B are a plan view and a cross-sectional view for explaining a conventional hybrid integrated circuit device, respectively.
Figure 6B:
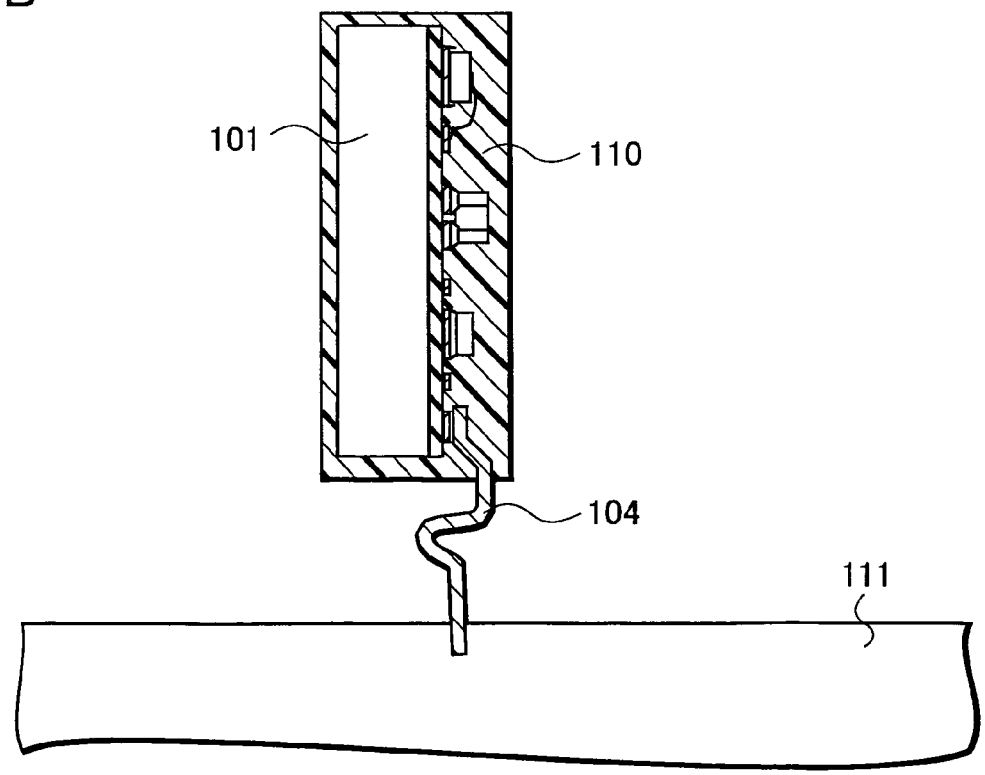
Figure 7:
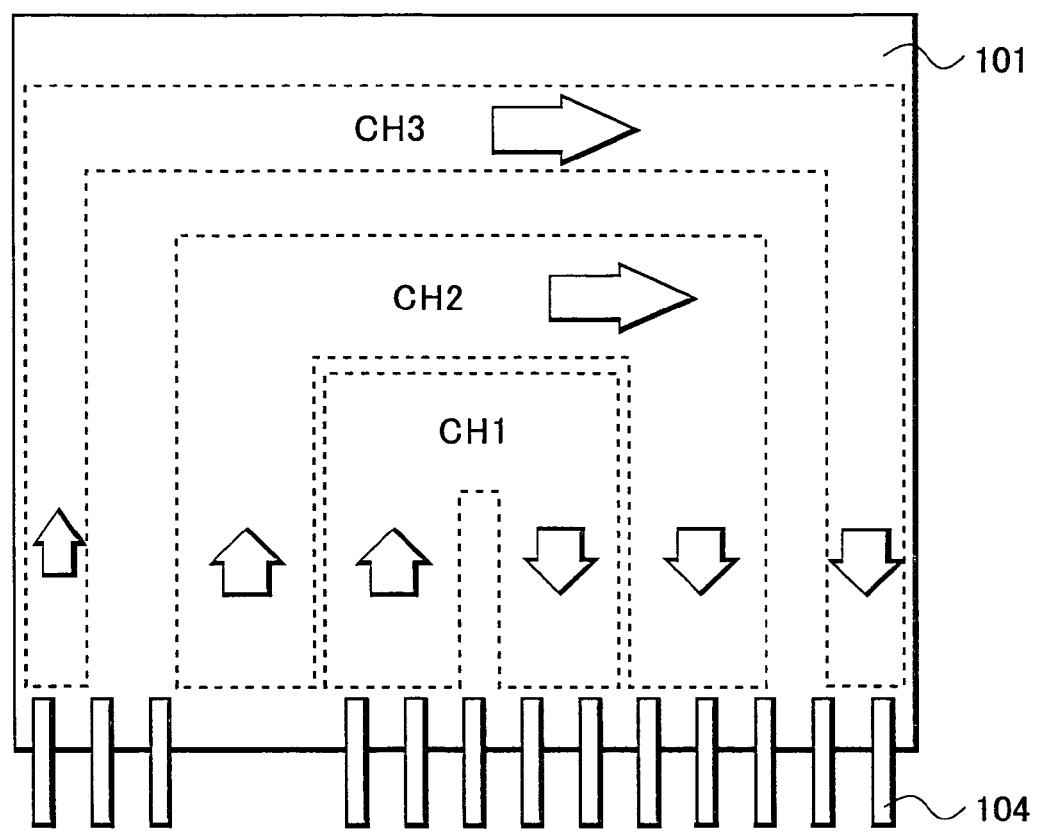
FIG. 7 is a plan view for explaining the conventional hybrid integrated circuit device.

With reference to FIGS. 5A to 5C, electrical signals processed by the hybrid integrated circuit device 10 of this embodiment will be described. FIG. 5A is a circuit diagram showing part of a circuit incorporated in the device, FIG. 5B is a waveform diagram showing properties of a signal inputted, and FIG. 5C is a waveform diagram showing properties of a signal outputted.

Referring to FIG. 5A, the level of voltage at PT1 through which a signal inputted into IC1 passes corresponds to a digital signal of approximately 3 V to 5 V. The waveform of this signal is shown in FIG. 5B. A signal obtained from a process performed based on the inputted signal inputted into IC1 is outputted from IC1. This output signal is a signal amplified for driving a transistor. Accordingly, the level of voltage at PT2 corresponds to a digital signal at a level of approximately 12 V.

Output signals from IC1 are applied to the control electrodes of TR1 and TR2, whereby these transistors are controlled. Further, an output signal is extracted from a midpoint of the bridge circuit formed of these transistors. The level of voltage at a point PT3 through which this output signal passes corresponds to a digital signal of a high voltage of, for example, approximately 50 V. In the case where a lowpass filter which converts this digital signal into an analog signal is formed outside the hybrid integrated circuit device 10, an output signal from OUT1 passes through the second lead 14B.

An output signal of the first channel CH1 and that of the second channel CH2 are converted into an analog signal by the first lowpass filter LF1. The waveform of this analog signal is shown in FIG. 5C. The level of voltage of this analog signal is approximately 50 V at a point PT4.

In the above description, the hybrid integrated circuit device 10 constitutes an audio amplifier module, but can also constitute an electric circuit for other use. For example, an inverter circuit, a DC/DC converter circuit, or the like can be constituted.

What is claimed is:

1. A hybrid integrated circuit device comprising:
a metal circuit board and a first surface of the circuit board being covered with an insulating layer;
a conductive pattern formed on the insulating layer wherein the conductive pattern includes pads on two opposite edges of the circuit board;
circuit elements positioned on and electrically connected to the conductive pattern to provide an electric circuit of the hybrid integrated circuit device;
a plurality of leads each having a first end portion fixed to the pads;
a sealing resin covering the circuit elements and the connection part of the pad and lead; and
a second surface of the metal circuit board being not covered by the sealing resin;
wherein the hybrid integrated circuit device is surface-mounted on a mount board using the leads, of which second end portions are fixed on a conducting path formed on the mount board and wherein the first surface is facing towards the mount board and the second surface is facing away from the mount board, and
wherein a circuit element is on a surface of the mount board in a region corresponding to a place under the circuit board.

2. The hybrid integrated circuit device according to claim 1,
wherein the second end portions of the leads are approximately parallel to the surface of the circuit board.

3. The hybrid integrated circuit device according to claim 1, wherein the second end portions of the leads extend to protrude in the same direction as a direction in which the circuit element is mounted.

4. The hybrid integrated circuit device according to claim 1, wherein the leads are formed in gull-wing shapes.

5. The hybrid integrated circuit device according to claim 1,
wherein a conducting path is formed on a front surface of the mount board, in a region corresponding to a place under the circuit board, and
the conducting path is connected to ground potential.

6. The hybrid integrated circuit device according to claim 1, wherein the first and second surfaces are on opposite sides of the circuit board.

7. The hybrid integrated circuit device according to claim 1, wherein the second surface is plane.

8. A hybrid integrated circuit device comprising:
a metal circuit board;
a conductive pattern formed on a front surface of the circuit board;
circuit elements electrically connected to the conductive pattern to provide a plurality of electric circuit channels of the hybrid integrated circuit device; and
a plurality of leads fixed to the plurality of electric circuit channels in a peripheral portion of the circuit board and led to an outside,
wherein the leads include first leads arranged to receive an input signal and second leads arranged to output an output signal controlled by the input signal and processed by one of the plurality of electric circuit channels,
the first and second leads are fixed to opposite edge portions of the circuit board, respectively, and
wherein each of the plurality of electric circuit channels includes a control circuit to generate a control signal based on an input signal and a switching circuit to perform switching according to the control signal.

9. The hybrid integrated circuit device according to claim 8,
wherein a circuit to generate the output signal by amplifying the input signal is formed of the conductive pattern and the circuit element, and
the circuit is formed on the front surface of the circuit board, in a region sandwiched between the first and second leads.

10. The hybrid integrated circuit device according to claim 9, wherein the plurality of circuits are arranged in parallel on the front surface of the circuit board.

11. The hybrid integrated circuit device according to claim 8, wherein a plurality of bridge circuits are on the surface of the circuit board and the hybrid integrated circuit device is arranged so that input signals of the bridge circuits are inputted through the first leads and output signals of the bridge circuits are outputted through the second leads.

12. A hybrid integrated circuit device comprising:
a metal circuit board and a first surface of the circuit board being covered with an insulating layer;
a conductive pattern formed on the insulating layer wherein the conductive pattern includes pads on two opposite edges of the circuit board;
circuit elements positioned on and electrically connected to the conductive pattern to provide an electric circuit of the hybrid integrated circuit device;
a plurality of leads each having a first end portion fixed to the pads;
a sealing resin covering the circuit elements and the connection part of the pad and lead; and
a second surface of the metal circuit board being not covered by the sealing resin;
wherein the hybrid integrated circuit device is surface-mounted on a mount board using the leads, of which second end portions are fixed on a conducting path formed on the mount board and wherein the first surface is facing towards the mount board and the second surface is facing away from the mount board, and
wherein a conducting path is formed on a front surface of the mount board, in a region corresponding to a place under the circuit board, and the conducting path is connected to ground potential.

13. The hybrid integrated circuit device according to claim 12,
wherein the second end portions of the leads are approximately parallel to the surface of the circuit board.

14. The hybrid integrated circuit device according to claim 12, wherein the second end portions of the leads extend to protrude in the same direction as a direction in which the circuit element is mounted.

15. The hybrid integrated circuit device according to claim 12, wherein the leads are formed in gull-wing shapes.

16. The hybrid integrated circuit device according to claim 12, wherein the first and second surfaces are on opposite sides of the circuit board.

17. The hybrid integrated circuit device according to claim 12, wherein the second surface is plane.

* * * * *